US010468282B2

(12) United States Patent
Lee et al.

(10) Patent No.: US 10,468,282 B2
(45) Date of Patent: Nov. 5, 2019

(54) METHOD AND APPARATUS FOR SUBSTRATE TRANSFER AND RADICAL CONFINEMENT

(71) Applicant: Applied Materials, Inc., Santa Clara, CA (US)

(72) Inventors: Jared Ahmad Lee, Santa Clara, CA (US); Martin Jeff Salinas, San Jose, CA (US); Paul B. Reuter, Austin, TX (US); Imad Yousif, San Jose, CA (US); Aniruddha Pal, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/963,758

(22) Filed: Apr. 26, 2018

(65) Prior Publication Data

US 2018/0247850 A1    Aug. 30, 2018

Related U.S. Application Data

(62) Division of application No. 13/985,843, filed as application No. PCT/US2012/027097 on Feb. 29, 2012, now Pat. No. 10,090,181.

(Continued)

(51) Int. Cl.
*H01L 21/677*    (2006.01)
*C23C 16/455*    (2006.01)
(Continued)

(52) U.S. Cl.
CPC .... *H01L 21/67742* (2013.01); *C23C 16/4586* (2013.01); *C23C 16/45517* (2013.01);
(Continued)

(58) Field of Classification Search
None
See application file for complete search history.

(56) References Cited

U.S. PATENT DOCUMENTS

| 4,139,051 A | 2/1979 | Jones et al. |
| 4,816,638 A | 3/1989 | Ukai et al. |

(Continued)

FOREIGN PATENT DOCUMENTS

| JP | 08-148473 A | 6/1996 |
| JP | 2001-25725 A | 9/2001 |

(Continued)

OTHER PUBLICATIONS

International Search Report and Written Opinion, PCT/US2012/027097, dated Oct. 4, 2012.
TW Office Action in related application TW 101106773 dated Dec. 18, 2015.
Japanese Office Action in related matter JP 2013-556824 dated Feb. 2, 2016.

(Continued)

*Primary Examiner* — Jiong-Ping Lu
(74) *Attorney, Agent, or Firm* — Patterson + Sheridan LLP

(57) ABSTRACT

Embodiments of the present invention provide an apparatus for transferring substrates and confining a processing environment in a chamber. One embodiment of the present invention provides a hoop assembly for using a processing chamber. The hoop assembly includes a confinement ring defining a confinement region therein, and three or more lifting fingers attached to the hoop. The three or more lifting fingers are configured to support a substrate outside the inner volume of the confinement ring.

14 Claims, 7 Drawing Sheets

Related U.S. Application Data

(60) Provisional application No. 61/448,012, filed on Mar. 1, 2011.

(51) Int. Cl.
    *C23C 16/458* (2006.01)
    *H01L 21/687* (2006.01)
    *H01L 21/67* (2006.01)
    *H01L 21/306* (2006.01)

(52) U.S. Cl.
    CPC ........ *H01L 21/306* (2013.01); *H01L 21/6719* (2013.01); *H01L 21/67739* (2013.01); *H01L 21/68735* (2013.01); *H01L 21/68742* (2013.01); *H01L 21/67751* (2013.01)

(56) References Cited

U.S. PATENT DOCUMENTS

| | | | |
|---|---|---|---|
| 4,952,299 | A | 8/1990 | Chrisos et al. |
| 5,071,714 | A | 12/1991 | Rodbell et al. |
| 5,188,979 | A | 2/1993 | Filipiak |
| 5,198,634 | A | 3/1993 | Mattson et al. |
| 5,217,501 | A | 6/1993 | Fuse et al. |
| 5,332,443 | A | 7/1994 | Chew et al. |
| 5,337,207 | A | 8/1994 | Jones et al. |
| 5,356,833 | A | 10/1994 | Maniar et al. |
| 5,376,213 | A | 12/1994 | Ueda et al. |
| 5,522,937 | A | 6/1996 | Chew et al. |
| 5,545,289 | A | 8/1996 | Chen et al. |
| 5,571,367 | A | 11/1996 | Nakajima et al. |
| 5,633,073 | A | 5/1997 | Cheung et al. |
| 5,641,702 | A | 6/1997 | Imai et al. |
| 5,643,366 | A | 7/1997 | Somekh et al. |
| 5,753,133 | A | 5/1998 | Wong et al. |
| 5,753,891 | A | 5/1998 | Iwata et al. |
| 5,840,200 | A | 11/1998 | Nakagawa et al. |
| 5,895,549 | A | 4/1999 | Goto et al. |
| 5,904,799 | A | 5/1999 | Donohoe |
| 5,948,704 | A | 9/1999 | Benjamin et al. |
| 5,976,310 | A | 11/1999 | Levy |
| 6,000,227 | A | 12/1999 | Kroeker |
| 6,035,101 | A | 3/2000 | Sajoto et al. |
| 6,114,216 | A | 9/2000 | Yieh et al. |
| 6,136,211 | A | 10/2000 | Qian et al. |
| 6,143,082 | A | 11/2000 | McInerney et al. |
| 6,148,072 | A | 11/2000 | Huang |
| 6,204,141 | B1 | 3/2001 | Lou |
| 6,228,563 | B1 | 5/2001 | Starov et al. |
| 6,228,739 | B1 | 5/2001 | Ha et al. |
| 6,257,168 | B1 | 7/2001 | Ni et al. |
| 6,264,706 | B1 | 7/2001 | Hirano |
| 6,267,074 | B1 | 7/2001 | Okumura |
| 6,270,568 | B1 | 8/2001 | Droopad et al. |
| 6,270,582 | B1 | 8/2001 | Rivkin et al. |
| 6,297,095 | B1 | 10/2001 | Muralidhar et al. |
| 6,299,691 | B1 | 10/2001 | Oda et al. |
| 6,300,202 | B1 | 10/2001 | Hobbs et al. |
| 6,300,212 | B1 | 10/2001 | Inoue et al. |
| 6,319,730 | B1 | 11/2001 | Ramdani et al. |
| 6,326,261 | B1 | 12/2001 | Tsang et al. |
| 6,335,207 | B1 | 1/2002 | Joo et al. |
| 6,348,386 | B1 | 2/2002 | Gilmer |
| 6,358,859 | B1 | 3/2002 | Lo et al. |
| 6,375,746 | B1 | 4/2002 | Stevens et al. |
| 6,399,507 | B1 | 6/2002 | Nallan et al. |
| 6,414,280 | B1 | 7/2002 | Nishitani et al. |
| 6,431,807 | B1 | 8/2002 | Stevens et al. |
| 6,440,864 | B1 | 8/2002 | Kropewnicki et al. |
| 6,458,253 | B2 | 10/2002 | Ando et al. |
| 6,466,426 | B1 | 10/2002 | Mok et al. |
| 6,479,801 | B1 | 11/2002 | Shigeoka et al. |
| 6,485,988 | B2 | 11/2002 | Ma et al. |
| 6,514,378 | B1 | 2/2003 | Ni et al. |
| 6,528,427 | B2 | 3/2003 | Chebi et al. |
| 6,592,771 | B1 | 7/2003 | Yamanaka et al. |
| 6,616,767 | B2 | 9/2003 | Zhao et al. |
| 6,635,185 | B2 | 10/2003 | Demmin et al. |
| 6,688,375 | B1 | 2/2004 | Turner et al. |
| 6,890,861 | B1 | 5/2005 | Bosch |
| 6,899,507 | B2 | 5/2005 | Yamagishi et al. |
| 6,935,466 | B2 | 8/2005 | Lubomirsky |
| 7,045,014 | B2 | 5/2006 | Mahon et al. |
| 7,207,766 | B2 | 4/2007 | Kurita et al. |
| 7,396,480 | B2 | 7/2008 | Kao et al. |
| 7,497,414 | B2 | 3/2009 | Lee et al. |
| 7,506,654 | B2 | 3/2009 | Chandran et al. |
| 7,695,232 | B2 | 4/2010 | Moore et al. |
| 7,732,728 | B2 | 6/2010 | Dhindsa et al. |
| 7,846,845 | B2 | 12/2010 | Bahng et al. |
| 8,033,769 | B2 | 10/2011 | Gage et al. |
| 8,060,252 | B2 | 11/2011 | Gage et al. |
| 8,272,825 | B2 | 9/2012 | Hofmeister et al. |
| 8,662,812 | B2 | 3/2014 | Hofmeister et al. |
| 8,845,816 | B2 | 9/2014 | Diaz et al. |
| 8,992,689 | B2 | 3/2015 | Diaz et al. |
| 10,090,181 | B2 | 10/2018 | Lee et al. |
| 10,204,805 | B2 | 2/2019 | Yousif et al. |
| 2001/0055852 | A1 | 12/2001 | Moise et al. |
| 2002/0011207 | A1 | 1/2002 | Uzawa et al. |
| 2002/0025375 | A1 | 2/2002 | Takamori et al. |
| 2002/0046810 | A1 | 4/2002 | Tanaka et al. |
| 2002/0074312 | A1 | 6/2002 | Ou-Yang et al. |
| 2002/0104751 | A1 | 8/2002 | Drewery et al. |
| 2002/0144786 | A1 | 10/2002 | Chiang et al. |
| 2003/0003696 | A1 | 1/2003 | Gelatos et al. |
| 2003/0045131 | A1 | 3/2003 | Verbeke et al. |
| 2003/0057179 | A1 | 3/2003 | Luo et al. |
| 2003/0092278 | A1 | 5/2003 | Fink |
| 2003/0170986 | A1 | 9/2003 | Nallan et al. |
| 2004/0002223 | A1 | 1/2004 | Nallan et al. |
| 2004/0007176 | A1 | 1/2004 | Janakiraman et al. |
| 2004/0007561 | A1 | 1/2004 | Nallan et al. |
| 2004/0043544 | A1 | 3/2004 | Asai et al. |
| 2004/0177810 | A1 | 9/2004 | Ohta |
| 2004/0203251 | A1 | 10/2004 | Kawaguchi et al. |
| 2004/0226514 | A1 | 11/2004 | Mahon et al. |
| 2005/0183827 | A1 | 8/2005 | White et al. |
| 2005/0189074 | A1 | 9/2005 | Kasai et al. |
| 2005/0208714 | A1 | 9/2005 | Yamazaki et al. |
| 2005/0224181 | A1 | 10/2005 | Merry et al. |
| 2006/0105575 | A1 | 5/2006 | Bailey et al. |
| 2006/0231027 | A1 | 10/2006 | Iwabuchi |
| 2006/0234178 | A1 | 10/2006 | Hayashi et al. |
| 2006/0245852 | A1 | 11/2006 | Iwabuchi |
| 2007/0062558 | A1 | 3/2007 | Suzuki et al. |
| 2007/0102286 | A1 | 5/2007 | Scheible et al. |
| 2007/0140814 | A1 | 6/2007 | Kurita et al. |
| 2007/0151514 | A1 | 7/2007 | Chen et al. |
| 2007/0166133 | A1 | 7/2007 | Lee et al. |
| 2007/0240631 | A1 | 10/2007 | Nijhawan et al. |
| 2008/0019666 | A1 | 1/2008 | Kato et al. |
| 2008/0056857 | A1 | 3/2008 | Hiroki |
| 2008/0099040 | A1 | 5/2008 | Bahng et al. |
| 2008/0105650 | A1 | 5/2008 | Sugai et al. |
| 2009/0014324 | A1 | 1/2009 | Kawaguchi et al. |
| 2009/0028761 | A1 | 1/2009 | Devine et al. |
| 2009/0031955 | A1 | 2/2009 | Lu et al. |
| 2009/0067823 | A1 | 3/2009 | Kusuda |
| 2009/0127102 | A1 | 5/2009 | Lee et al. |
| 2009/0142167 | A1 | 6/2009 | Gage et al. |
| 2009/0179365 | A1 | 7/2009 | Lerner et al. |
| 2009/0191030 | A1 | 7/2009 | Bluck et al. |
| 2009/0200269 | A1 | 8/2009 | Kadkhodayan et al. |
| 2009/0206056 | A1 | 8/2009 | Xu et al. |
| 2009/0233449 | A1* | 9/2009 | Lebouitz .......... H01L 21/67063 438/706 |
| 2010/0059478 | A1 | 3/2010 | Lee et al. |
| 2010/0133255 | A1 | 6/2010 | Bahng et al. |
| 2010/0147396 | A1 | 6/2010 | Yamagishi et al. |
| 2010/0190343 | A1 | 7/2010 | Aggarwal et al. |
| 2010/0288369 | A1 | 11/2010 | Chang et al. |
| 2011/0031214 | A1 | 2/2011 | Kim et al. |
| 2011/0052833 | A1 | 3/2011 | Hanawa et al. |

(56) References Cited

U.S. PATENT DOCUMENTS

| | | |
|---|---|---|
| 2011/0236600 A1 | 9/2011 | Fox et al. |
| 2011/0287632 A1 | 11/2011 | Brown et al. |
| 2011/0304078 A1 | 12/2011 | Lee et al. |
| 2012/0222813 A1 | 9/2012 | Pal et al. |
| 2012/0264051 A1* | 10/2012 | Angelov ............ H01L 21/683 430/256 |
| 2013/0224953 A1 | 8/2013 | Salinas et al. |
| 2013/0334199 A1 | 12/2013 | Yousif et al. |
| 2013/0337655 A1 | 12/2013 | Lee et al. |
| 2013/0340938 A1 | 12/2013 | Tappan et al. |
| 2014/0087561 A1 | 3/2014 | Lee et al. |
| 2018/0247850 A1 | 8/2018 | Lee et al. |

FOREIGN PATENT DOCUMENTS

| | | |
|---|---|---|
| JP | 2003100851 A | 4/2003 |
| JP | 2004241420 A | 8/2004 |
| JP | 2008-532287 A | 8/2008 |
| KR | 10-2007-0031230 A1 | 3/2007 |
| KR | 20070031232 A | 3/2007 |
| WO | 2006/091588 A2 | 8/2006 |
| WO | 2012118897 A2 | 9/2012 |

OTHER PUBLICATIONS

Korean Office Action (with attached English translation) for Application No. 10-2013-7023302; dated Feb. 23, 2018; 10 total pages.

* cited by examiner

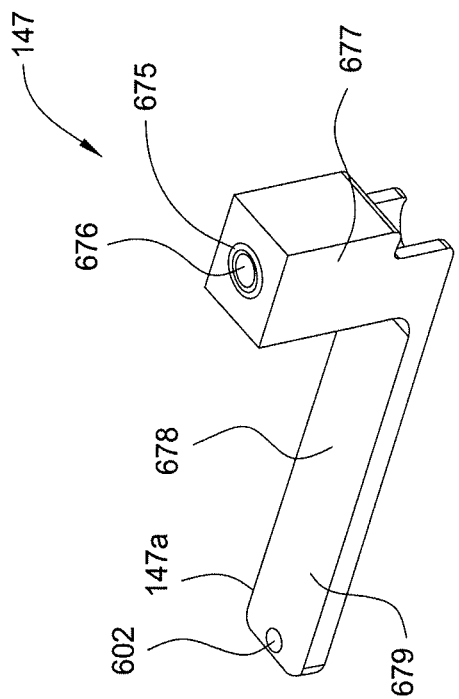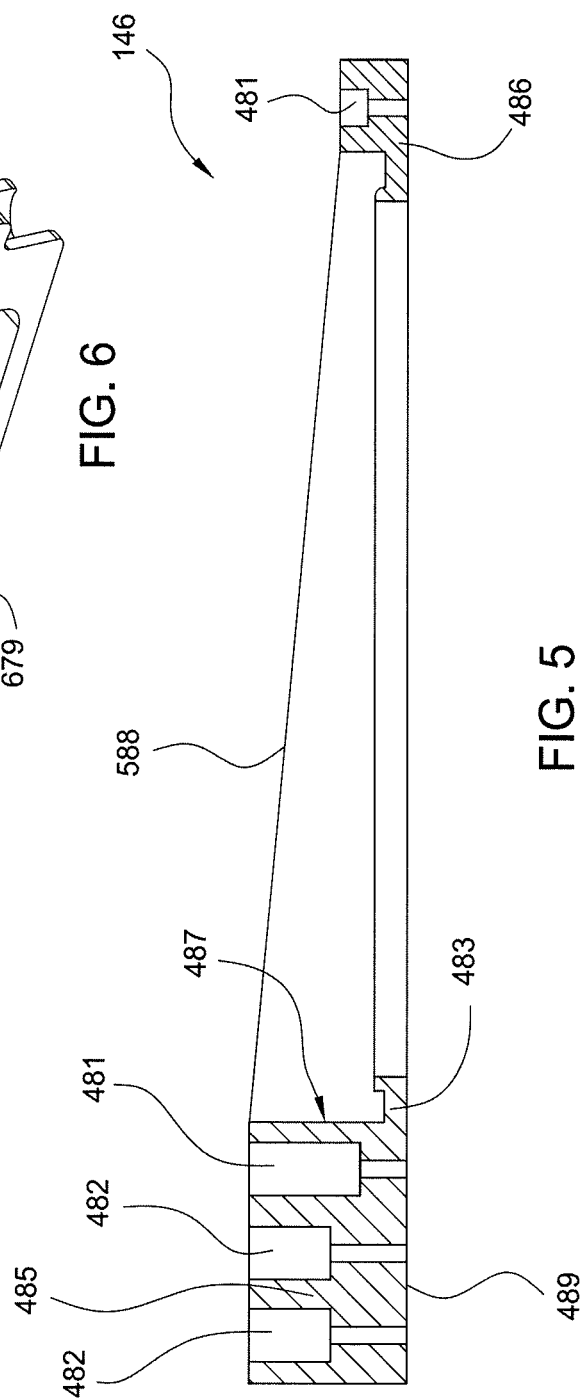

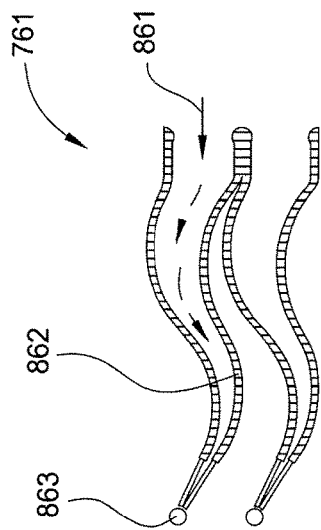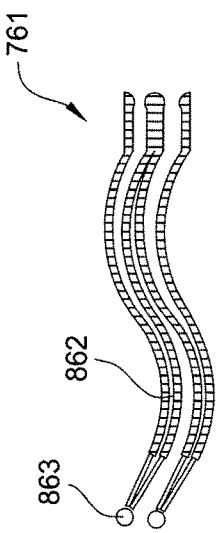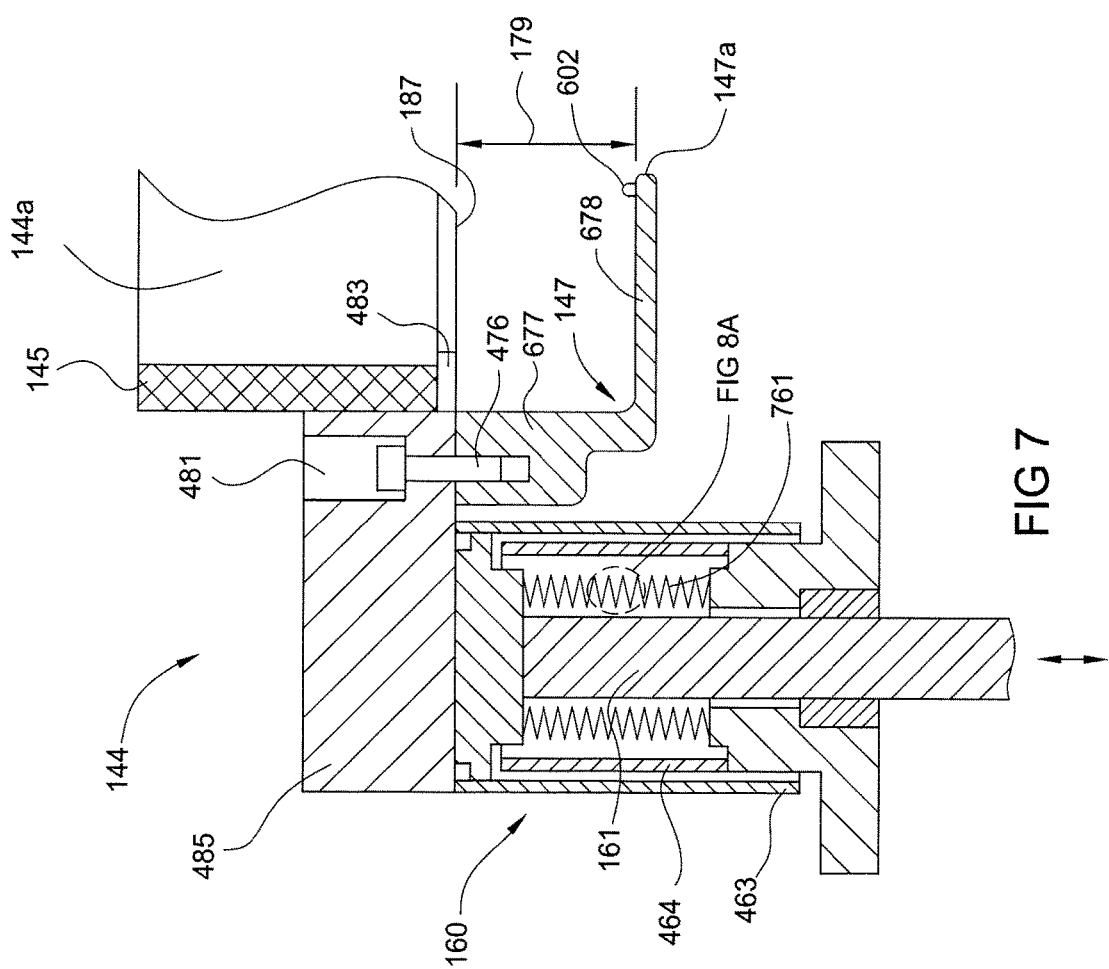

METHOD AND APPARATUS FOR SUBSTRATE TRANSFER AND RADICAL CONFINEMENT

BACKGROUND

Field

Embodiments of the present invention generally relate to a method and apparatus for fabricating devices on a semiconductor substrate. More particularly, embodiments of the present invention provide an apparatus for transferring substrates and confining a processing environment in a chamber.

Description of the Related Art

During manufacturing of semiconductor devices, a substrate is usually processed in a processing chamber, where deposition, etching, and thermal processing may be performed to the substrate. Improving process uniformity and reducing particle contamination are two constant goals for semiconductor processing, especially as dimensions of semiconductor devices rapidly reduce.

A semiconductor processing chamber generally includes a chamber body defining an inner volume for processing a substrate. A substrate support is usually disposed in the inner volume to support the substrate during processing. One or more slit valve doors may be formed through the chamber body to allow passage of the substrate into and out of the inner volume. Gas supply paths and pumping channels are also formed through the chamber body to provide processing gas and pump the inner volume to a desired pressure. The slit valve opening, the gas supply paths, the pumping channels, and the substrate support usually cause the inner wall of the chamber body to be asymmetrical and/or irregular, thus causing non-uniform conductance and/or electric field asymmetries. As a result, different areas on the substrate may be exposed to different processing conditions and uniformity of processing across the substrate decreases. Furthermore, the processing gas may travel to the slit valve area and cause contamination around the slit valve area.

Therefore, there is a need for methods and apparatus for improving process uniformity and reducing contamination in a semiconductor processing chamber.

SUMMARY

Embodiments of the present invention generally provide apparatus and methods for processing a substrate. More particularly, embodiments of the present invention provide an apparatus for transferring substrates and confining a processing environment in a chamber.

One embodiment of the present invention provides a hoop assembly for use in a processing chamber. The hoop assembly includes a confinement ring defining a confinement region therein, and three or more lifting fingers extending below the confinement ring. Each of the three or more lifting fingers has a contact tip positioned radially inward from the confinement ring to form a substrate support surface below and spaced apart from the confinement region defined by the confinement ring.

Another embodiment of the present invention provides a chamber for processing a substrate. The chamber includes a chamber body defining a chamber volume therein, a substrate support pedestal assembly disposed in the chamber volume, and a hoop assembly moveable within the chamber volume. The chamber body has a sealable substrate transfer opening. The hoop assembly includes a confinement ring movable between an elevated position and a lowered position. The confinement ring defines a confinement region above the substrate support pedestal assembly in the lowered position.

Yet another embodiment of the present invention provides a method for processing a substrate. The method includes transferring a substrate through an opening of a processing chamber to three or more lifting fingers of a hoop assembly disposed in the processing chamber. The hoop assembly comprises a confinement ring defining a cylindrical confinement region therein. The method further includes lowering the hoop assembly to transfer the substrate from the lifting fingers to a substrate support pedestal assembly disposed in the processing chamber, and positioning the hoop assembly in a processing position. The confinement region is at least immediately above the substrate disposed on the substrate support pedestal assembly with the confinement ring shielding the opening. The method further includes processing the substrate by supplying a processing gas to the confinement region with the hoop assembly in the processing position.

In the method described above, a height of the confinement ring spans from the substrate to a lower surface of a showerhead positioned above the substrate support pedestal assembly when the hoop assembly is in the processing position. The method above may further include elevating the confinement ring into a cavity formed in a ceiling of the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 is a sectional view of a hoop body according to one embodiment of the present invention.

FIG. 6 is a perspective view of a lifting finger according to one embodiment of the present invention.

FIG. 7 is a partial sectional side view of the hoop assembly showing a lift actuator having a bellows according to one embodiment of the present invention.

FIGS. 8A and 8B schematically illustrate the bellows in extended and compressed position.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide apparatus and methods for fabricating devices on a semiconductor substrate. More particularly, embodiments of the present invention relate to a substrate transfer apparatus having a structure for bounding a movable confinement region within a process volume of a processing chamber. The structure for bounding a movable confinement region may also be utilized without features for transferring a substrate within the processing chamber.

Embodiments of the present invention provide a hoop assembly for use in a chamber, such as a processing chamber or a load lock chamber. The hoop assembly includes three or more lifting fingers and a confinement ring. A lift actuator may be utilized to move the hoop assembly up and down. The hoop assembly can be used to pick up a substrate from a substrate support pedestal assembly using the lifting fingers, and to allow robot blades to transfer substrates in and out of the chamber by transferring the substrates to and from the lifting fingers. The confinement ring has a cylindrical inner wall that is substantially symmetric and defines and radially bounds a confinement region within a processing volume of the chamber. The confinement ring can be moved to a position circumscribing the substrate and substrate support pedestal assembly to create a symmetric confinement region around and immediately above the substrate by surrounding the substrate with its inner wall, thus eliminating processing non-uniformity cased by asymmetric or irregular shapes of the chamber walls, for example the effects of the slit tunnel area that connects the inner chamber volume to a slit valve door. Additionally, the confinement ring also reduces exposure of the slit tunnel area to process chemistry, thus keeping the slit tunnel area clean. The confinement ring may be formed from quartz material to reduce recombination of radicals around the substrate, theoretically increasing the radical flux to the substrate and subsequent process performance.

Figure 1:
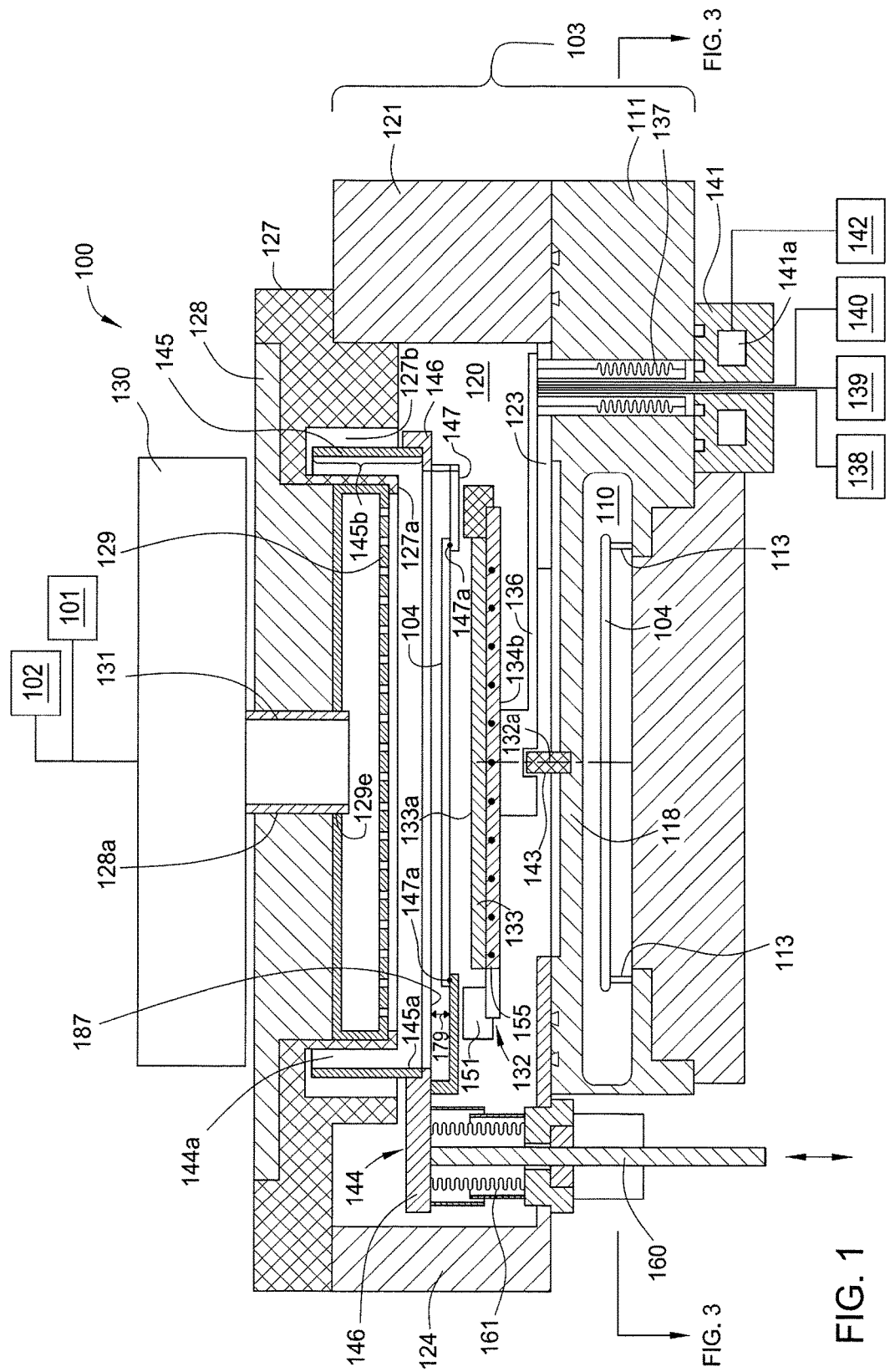
FIG. 1 is a schematic sectional view of a load lock chamber having a hoop assembly according to one embodiment of the present invention.

FIG. 1 is a schematic sectional view of a dual load lock chamber 100 having a hoop assembly 144 according to one embodiment of the present invention. Although the hoop assembly 144 is described in the context of a load lock chamber having a processing volume, is it understood that the hoop assembly 144 may be utilized in any suitably adapted load lock and/or processing chamber, including those having a single processing volume, where it is desirable to have a symmetrical confinement region.

The dual load lock chamber 100 includes an upper chamber volume 120 for transferring and processing a substrate 104, and a lower chamber volume 110 for transferring a substrate 104. The upper chamber volume 120 and the lower chamber volume 110 are vertically stacked and are isolated from one another. Each of the lower and upper load lock volumes 110, 120 may be selectively connected to two adjacent external environments (i.e., a factory interface and transfer chamber, both not shown) through two openings for substrate transferring.

The dual load lock chamber 100 includes a chamber body 103. In one embodiment, the chamber body 103 includes an upper chamber body 121 and a lower chamber body 111 coupled together to define the upper and lower chamber volumes 120, 110.

The dual load lock chamber 100 may include a showerhead 129 disposed over the upper chamber volume 120, a substrate support pedestal assembly 132 disposed within the upper chamber volume 120, and a hoop assembly 144 to define a confinement region in the upper chamber volume 120 as well as to load and unload substrates. The dual load lock chamber 100 may include supporting pins 113 for supporting a substrate 104 in the lower chamber volume 110.

The upper chamber volume 120 is defined by sidewalls 124 of the upper chamber body 121, a lid ring 127 disposed over the sidewalls 124, a bottom wall 123 of the upper chamber body 121, and an upper wall 118 of the lower chamber body 111. The lid ring 127 has an inner lip 127a holding the showerhead 129 and a source adapter plate 128. The lid ring 127 forms a portion of the ceiling of the upper chamber volume 120. The source adapter plate 128 has a central opening 128a that matches with a central opening 129e of the showerhead 129. A remote plasma source 130 is in fluid communication with the upper chamber volume 120 through a quartz insert 131 and the showerhead 129.

The remote plasma source 130 is generally connected to one or more gas panels. In one embodiment, the remote plasma source 130 is connected to a first gas panel 101 configured for providing processing gases for an abatement process to remove residual material after etching and a second gas panel 102 configured for providing processing gases for an ashing process to remove photoresist.

It is also contemplated that one or more plasma generators may be optionally utilized to sustain a plasma within the upper chamber volume 120 in lieu of, or in addition to the remote plasma source 130. The plasma generator may be RF driven coils positioned outside of or within the upper chamber volume 120, and/or an RF driven electrode, at least one disposed in the substrate support pedestal assembly 132, above the showerhead 129, or the showerhead 129 itself.

The substrate support pedestal assembly 132 is disposed in the upper chamber volume 120 for supporting and heating the substrate 104 using internal heaters (not shown). A focus ring 151 may be disposed on an outer edge of the substrate support pedestal assembly 132. The focus ring 151 functions to retain the substrate 104 and to modify a processing rate around an edge area of the substrate 104 during processing.

The substrate support pedestal assembly 132 is mounted on an insulator 143 disposed on the upper wall 118 of the lower chamber body 111. The insulator 143 prevents heat transfer between the substrate support pedestal assembly 132 and the chamber body 103. In one embodiment, the insulator 143 aligns with a central axis 132a of the substrate support pedestal assembly 132 to ensure that the substrate support pedestal assembly 132 remains centered during thermal expansion.

A cantilever tube 136 is attached to a backside 134b near the center of the substrate support pedestal assembly 132. The cantilever tube 136 extends radially outwards to connect with a vertical tube 137. The tubes 136, 137 do not contact the upper chamber body 121 or the lower chamber body 111 to further avoid heat exchange between the substrate support pedestal assembly 132 and the chamber bodies 111, 121. The cantilever tube 136 and the vertical tube 137 provide a passage for power supplies, sensors and other wiring to be used by the substrate support pedestal assembly 132. In one embodiment, a heater power source 138, a sensor signal receiver 139 and a chucking control unit 140 are wired to the substrate support pedestal assembly 132 through the passage in the cantilever tube 136 and the vertical tube 137.

A cooling adaptor 141 is coupled to the vertical tube 137 from outside of the lower chamber body 111. A source for cooling fluid 142 is connected to cooling channels 141a disposed in the cooling adaptor 141. The cooling adaptor 141 controls the rate and direction of heat exchange between the vertical tube 137, the cantilever tube 136, and the substrate support pedestal assembly 132. In one embodiment, thermal breaks, such as bimetal connectors, may be used for connecting vertical tube 137, the cantilever tube 136, and the substrate support pedestal assembly 132 to thermally isolate the substrate support pedestal assembly 132 from the chamber body 103, thereby allowing more precise control and rapid response of the temperature of the substrate heated by the pedestal assembly 132.

A more detailed description of the upper and lower chamber bodies can be found in U.S. Provisional Patent Application Ser. No. 61/448,027, filed Mar. 1, 2011, entitled "Abatement and Strip Process Chamber in a Dual Load Lock Configuration".

A more detailed description of the substrate support pedestal assembly 132 can be found in United States Provisional Patent Application Serial No. 61/448,018, filed Mar. 1, 2011, entitled "Thin Heated Substrate Support".

The hoop assembly 144 is disposed in the upper chamber volume 120 according one embodiment of the present invention. As previously stated, the hoop assembly 144 may be used in other processing chambers and/or load lock chambers. The hoop assembly 144 has two functions. First, the hoop assembly 144 is vertically positionable to enable transfer of substrates between the substrate support pedestal assembly 132 and substrate transfer devices (e.g., robot end effectors) entering the upper chamber volume 120. Second, the hoop assembly 144 defines a symmetrical confinement region 144a around the substrate 104 and region immediately above the substrate support pedestal assembly 132 during processing, thus, providing a symmetrical processing environment in the upper chamber volume 120 which enhances processing results. The hoop assembly 144 may also be utilized solely for establishing a symmetrical confinement region within a processing volume.

The hoop assembly 144 includes a ring-shaped hoop body 146 disposed within the upper chamber volume 120. The ring-shaped hoop body 146 has an inner diameter which is greater than a diameter of the substrate support pedestal assembly 132. The hoop body 146 is coupled to a shaft 160 that extends through the chamber body 103 to a lift actuator 169. The lift actuator 169, such as a linear actuator or motor, is operable to control the vertical elevation of the hoop body 146 within the upper chamber volume 120. In one embodiment, bellows 161 are provided to prevent leakage between the shaft 160 and the chamber body 103.

The hoop assembly 144 also includes three or more lifting fingers 147 attached to the hoop body 146. The lifting fingers 147 are used to transfer substrates between the substrate support pedestal assembly 132 and substrate transfer devices, such as robots, extending into the upper chamber volume 120 when the hoop assembly 144 is in an upper transfer position, as shown in FIG. 1. The lifting fingers 147 extend vertically downwards and turn radially inwards from the hoop body 146, terminating in a tip 147a. The tips 147a of the lifting fingers 147 form a substrate support surface to support the substrate 104 at several points near an edge region of the substrate 104. A spacing 179 is defined between a lower surface of the hoop body 146 and tips 147a which is sufficient to allow a robot end effector to lift a substrate 104 from the tips 147a of the lifting fingers 147 without hitting the lower surface of the hoop body 146.

The hoop assembly 144 also includes a confinement ring 145 supported by the hoop body 146. The confinement ring 145 extends vertically upwards from the hoop body 146. In one embodiment, the confinement ring 145 is a cylindrical ring having a substantially cylindrical inner wall 145a. The height 145b of the inner wall 145a is much greater than the thickness of the substrate 104 so that the inner wall 145a can confine a portion of the upper processing volume as a symmetrical confinement region 144a around and above the substrate 104. In one embodiment, the height 145b of the inner wall 145a of the confinement ring 145 is much greater than the thickness of the substrate support pedestal assembly 132 to allow the confinement ring 145 to overlap the substrate support pedestal assembly 132 while still extending sufficiently above the substrate 104 disposed on the substrate support pedestal assembly 132. The inner wall 145a of the confinement ring 145 has a diameter greater than the outer diameter of the substrate support pedestal assembly 132. The inner wall 145a of the confinement ring 145 may also have a diameter greater than the outer diameter of the showerhead 129. In one embodiment, the confinement ring 145 has a height 145b sufficient to simultaneously overlap both the substrate support pedestal assembly 132 and showerhead 129 during processing.

Figure 2:
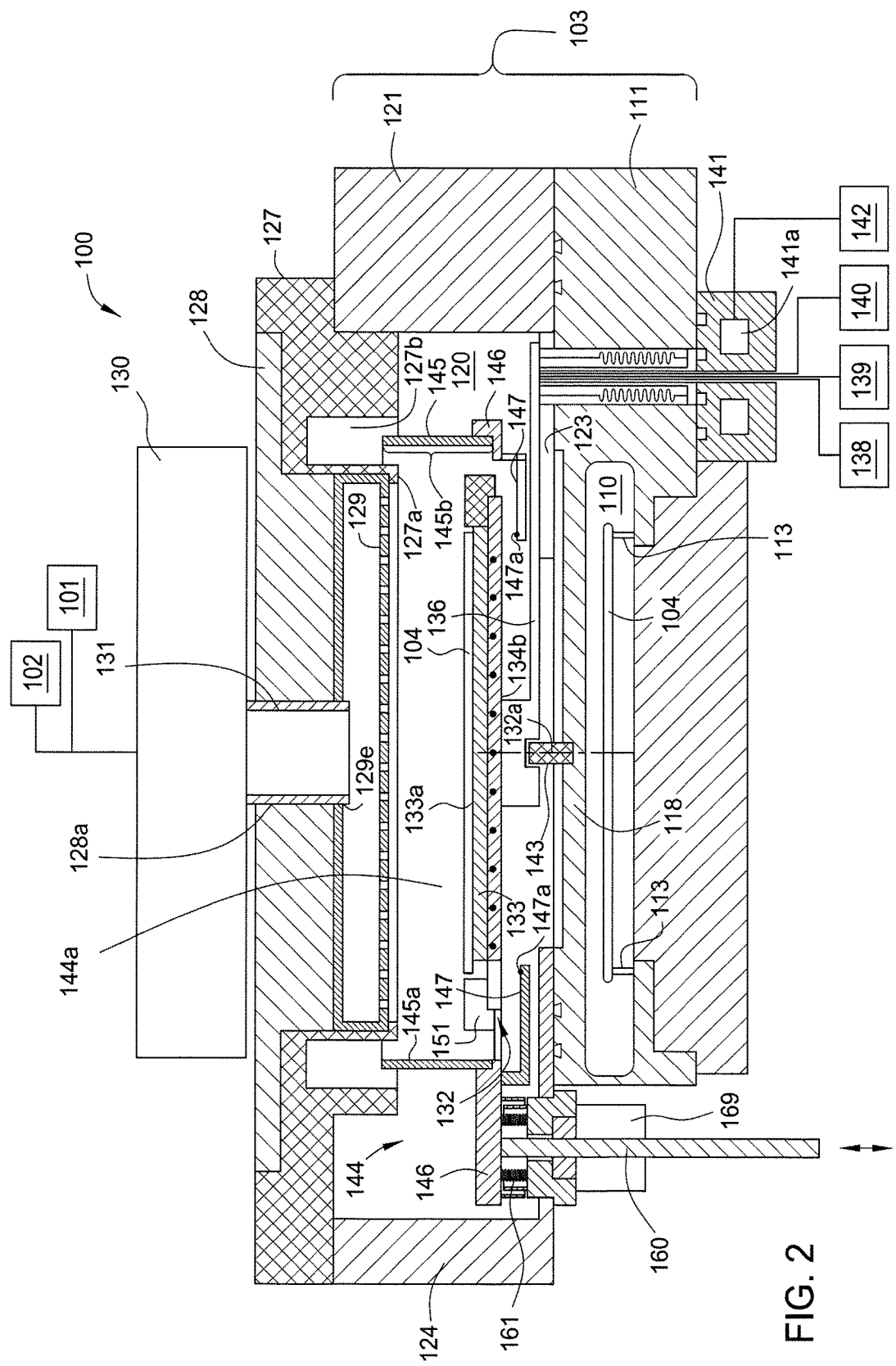
FIG. 2 is a schematic sectional view of the load lock chamber of FIG. 1 with the hoop assembly in a loading/unloading position.

During processing, the lift actuator 169 may position the hoop body 146 in a lowered, processing position, as shown in FIG. 2, so that the confinement ring 145 bounds and thereby creates a cylindrical confinement region 144a within the upper chamber volume 120 around the substrate 104 disposed on the substrate support pedestal assembly 132. In the embodiment depicted in FIG. 2, the cylindrical confinement region 144a within the upper chamber volume 120 has a completely symmetrical cylindrical boundary as the inner wall 145a shields the cylindrical confinement region 144a from asymmetries which may be present in the chamber body 103, such as slit valve tunnels and the like. The symmetrical processing environment provided by the cylindrical confinement region 144a enhances process uniformity by reducing conductance and/or electrical asymmetries which have a negative effect on substrate process uniformity.

The lifting fingers 147 of the hoop assembly 144 are aligned with cut outs 155 formed in the substrate support pedestal assembly 132. As the hoop assembly 144 is lowered, the tips 147a of the lifting fingers 147 pass below the upper surface 133a of the substrate support pedestal assembly 132 and into the cut outs 155 thereby transferring the substrate 104 from the tips 147a of the lifting fingers 147 to the upper surface 133a of the substrate support pedestal assembly 132. Conversely, as the hoop body 146 is raised, the lifting fingers 147 move upward through the cut outs 155 to come in contact with and lift the substrate 104 from the upper surface 133a of the substrate support pedestal assembly 132.

Returning back to FIG. 1, a cavity 127b is formed in the lid ring 127 which accepts the upper portion of the confinement ring 145 when the hoop assembly 144 is in the elevated position. In one embodiment, the cavity 127b is an annular slot. The cavity 127b allows the lifting fingers 147 to be aligned with the slit valve tunnel (not shown) thereby enabling substrate transfer with the robot end effector (also not shown) without increasing the volume of the upper chamber volume 120 to accommodate the motion of the confinement ring 145 which would disadvantageously result in slower pumping times, increase gas usage, larger pumps, higher energy consumption and higher chamber fabrication costs.

Figure 3:
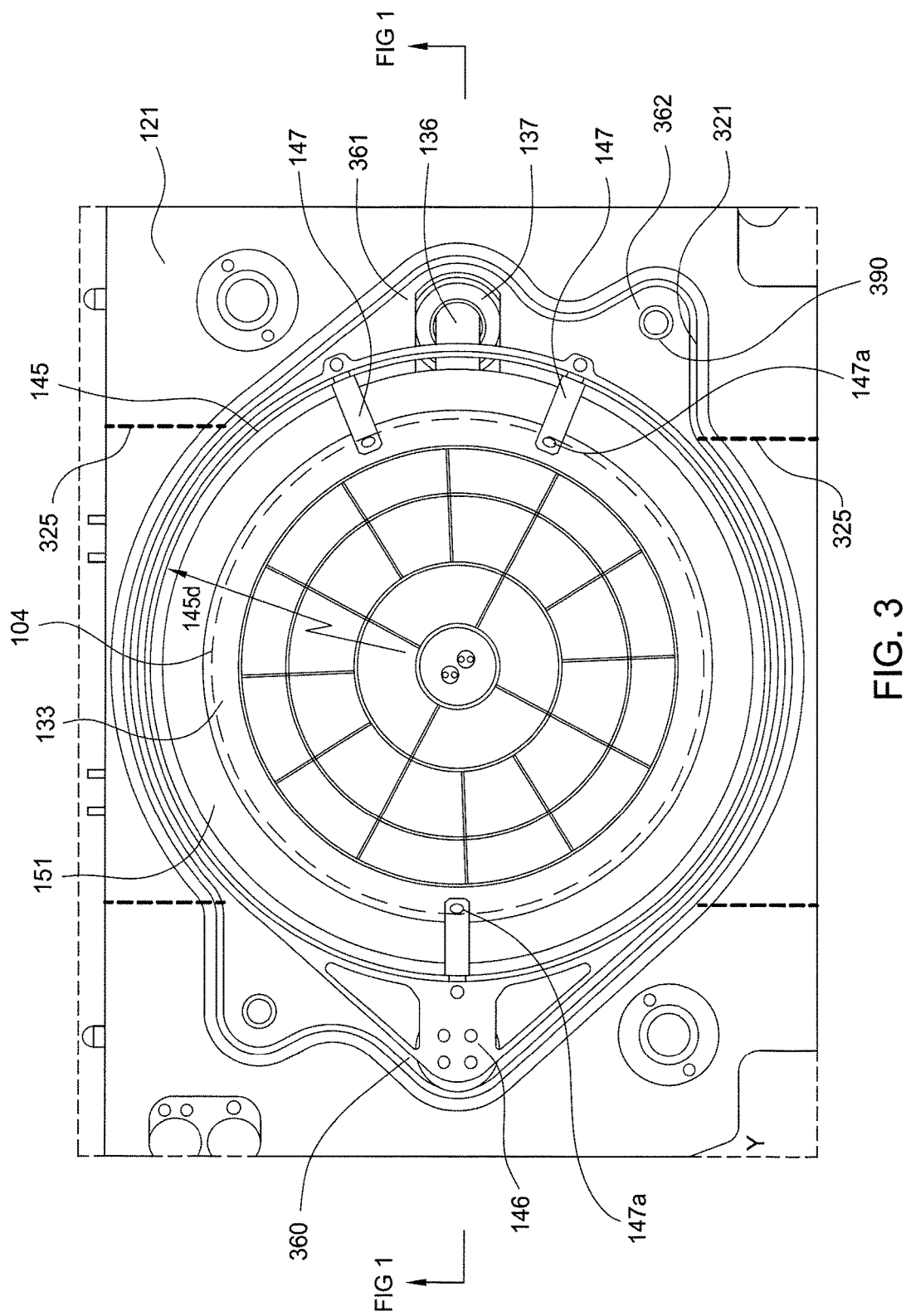
FIG. 3 is a schematic top view of a load lock chamber having a hoop assembly according to one embodiment of the present invention.

FIG. 3 schematically illustrates a top view of the hoop assembly 144 positioned within the upper chamber volume 120 of the upper chamber body 121 with the showerhead 129 removed. Two substrate transfer openings 325 are formed through the sidewalls 124 to allow substrate transferring and passage of external robots. A slit valve door (not shown) may be attached outside of each opening 325 to selectively seal the upper chamber volume 120 from the adjacent environments external to the upper chamber volume 120.

The hoop body 146 and the confinement ring 145 have an inner diameter 145d large enough to surround the substrate 104 and substrate support pedestal assembly 132, thereby defining and bounding the symmetrical confinement region 144a directly above the substrate 104. The lifting fingers 147 extend radially inward from the hoop body 146 and the confinement ring 145 to a diameter less than that of the substrate 104 and substrate support pedestal assembly 132, thereby allowing the fingers 147 to support the substrate 104 when lifted above the substrate support pedestal assembly 132.

In the embodiment shown in FIG. 3, three lifting fingers 147 are used to define a substrate supporting surface. The three lifting fingers 147 are arranged so that the lifting fingers 147 do not interfere with the robot end effectors extending into the upper chamber volume 120 through the openings 325. In one embodiment, the lifting fingers 147 form a Y shape with single lifting finger 147 on the side of the hoop body 146 connected to the shaft 160 and the remaining pair of lifting fingers 147 located on the opposite side of the hoop body 146 and spaced equidistant from the single lifting finger 147.

As shown in FIG. 3, the upper chamber body 121 has an irregular (e.g., not cylindrical) inner wall 321 with openings 325 for slit valve doors positioned on opposite sides and extra cut outs 360, 361, 362 for the shaft 160, the vertical tube 137 connected to the substrate support pedestal assembly 132, and vacuum ports 390. The confinement ring 145 is positioned around the substrate support pedestal assembly 132 to shield the processing region (e.g., containment region 144a) above the substrate 104 from the irregular shape of the inner wall 321 of the upper chamber body 121 (such as the substrate transfer openings 325) and provide a substantially symmetrical vertical boundary radially around the substrate support pedestal assembly 132 and region of the processing volume directly thereabove. In one embodiment, the confinement ring 145 and the substrate support pedestal assembly 132 are substantially concentric.

Figure 4:
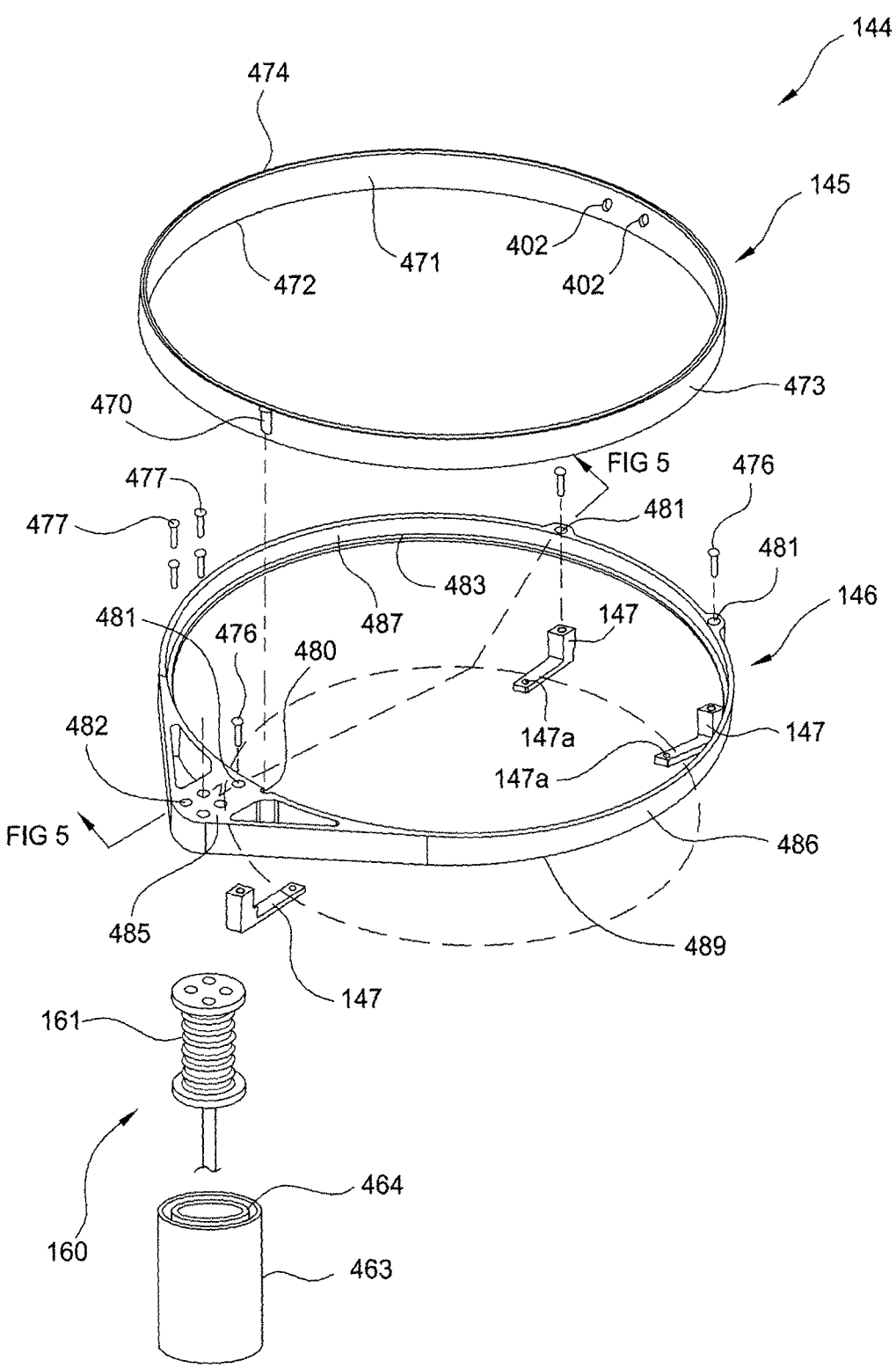
FIG. 4 is an exploded view of the hoop assembly according to one embodiment of the present invention.

FIG. 4 is an exploded view of the hoop assembly 144 according to one embodiment of the present invention. An inner lip 483 of the hoop body 146 extends radially inward and provides a substantially planar surface for supporting the confinement ring 145. The lifting fingers 147 may be attached to a lower surface 489 of the hoop body 146 using suitable fasteners, adhesives or other fastening method. In one embodiment, screws 476 may be used to attach the lifting fingers 147 to the hoop body 146. The bellows 161 attached to an upper end of the shaft 160 may be attached to a handle portion 485 of the hoop body 146. In one embodiment, the bellows 161 may be attached to the hoop body 146 by one or more screws 477. One or more shields 463, 464 may be disposed around the bellows 161 to reduce particle contamination resulting from the motion of the bellows 161.

In one embodiment, the confinement ring 145 is a cylindrical sleeve ring whose inner surface 471 is a cylindrical wall. An upper end 474 and a lower end 472 of the confinement ring 145 may be substantially parallel to one another. The confinement ring 145 may include one or more through holes 402 to allow viewing of the confinement region through the confinement ring 145. In one embodiment, the confinement ring 145 may be formed from quartz. The quartz confinement ring 145 together with the quartz showerhead 129 creates a quartz lining for the plasma during processing, therefore, reducing species recombination and particle contamination.

A substantially vertical ridge 470 is formed on an outer surface 473 of the confinement ring 145. The vertical ridge 470 may not extend completely to the bottom the lower end 472 of the confinement ring 145 to ensure the correct orientation of the confinement ring 145, as further discussed below.

In one embodiment, the hoop body 146 includes a frame portion 486 having a cylindrical inner wall 487 and the handle portion 485 extending radially outward from the frame portion 486 on one side. A substantially vertical notch 480 may be formed in the cylindrical inner wall 487 of the frame portion 486. The notch 480 may not extend completely to the inner lip 483 of the hoop body 146. The notch 480 mates with the vertical ridge 470 of the confinement ring 145, thereby locating the confinement ring 145 to the hoop body 146 when assembled, as illustrated in FIG. 4A. Since the vertical ridge 470 extends from the upper end 474, the confinement ring 145 will only lay flat on the hoop body 146 if the ridge 470 is engaged with the notch 480 with the lower end 472 of the of the confinement ring 145 oriented towards the hoop body 146, thereby preventing installation of the confinement ring 145 in an up-side-down orientation.

Figure 4B:
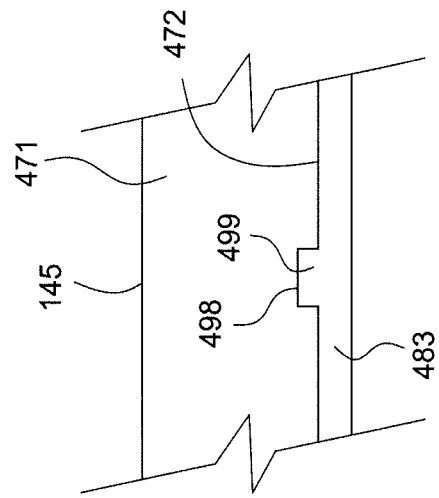
FIG. 4B is a partial view of a sector of the hoop assembly viewing outward from the center of the hoop assembly.
Figure 4A:
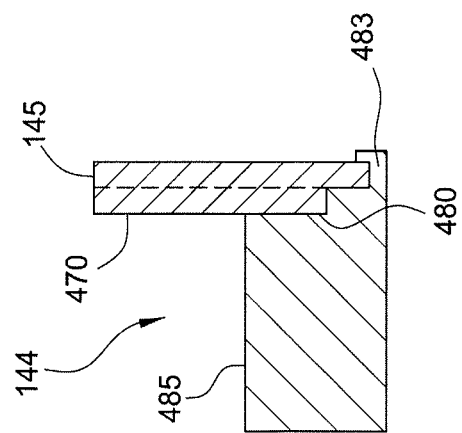
FIG. 4A is a partial sectional view of the hoop assembly.

Referring to the partial view of the hoop assembly depicted in FIG. 4B, one or more raised locating features 499 extend upwards from the inner lip 483 of the hoop body 146. Each of the one or more raised locating features 499 mate with an associated slot 498 formed in the lower end 472 of the of the confinement ring 145. The mating locating features 499 and slots 498 ensure a predefined angular orientation of the confinement ring 145 relative to the hoop body 146 that aligns the through holes 402 to allow viewing of the confinement region through the confinement ring 145 by a metrology sensor (not shown). In one embodiment, the hoop body 146 has three locating features 499 spaced on the inner lip 483 of the hoop body 146 while the confinement ring 145 has three similarly space slots 498. The three or more raised locating features 499 create a plane for the confinement ring 145 to rest on so that the confinement ring 145 does not tip or tilt.

To assemble, the ridge 470 of the confinement ring 145 and the notch 480 of the hoop body 146 are first aligned, and the confinement ring 145 is slip-fit inside the cylindrical inner wall 487 so that the lower end 472 of the confinement ring 145 rests on the inner lip 483 of the hoop body 146. The ridge 470 of the confinement ring 145 is locked in the notch 480 preventing relative motions between the confinement ring 145 and the hoop body 146. In one embodiment, the confinement ring 145 is removably disposed on the hoop body 146 to allow easy replacement.

Through holes 481, 482 may be formed through the hoop body 146 for mounting the lifting fingers 147 and the bellows 161 respectively. In one embodiment, both the lifting fingers 147 and the bellows 161 are attached to the hoop body 146 from a lower surface 489 of the hoop body 146.

FIG. 5 is a sectional view of the hoop body 146 along section 5-5 lines shown in FIG. 4. The hoop body 146 may be formed from a metal. In one embodiment, the hoop body 146 is formed from aluminum. The lower surface 489 of the hoop body 146 may be substantially flat. An upper surface 588 of the hoop body 146 may be slanted to reduce the thickness and to reduce bulk of hoop body 146 from the handle portion 485 to the frame portion 486.

FIG. 6 is a perspective view of the lifting finger 147 according to one embodiment of the present invention. Each lifting finger 147 may have an L shape with a vertical portion 677 connected to a horizontal portion 678. A hole 676 may be formed on the vertical portion 677 and a threaded insert 675 may be disposed in the hole 676. The threaded insert 675 mates with the screw 476 for attaching the lifting finger 147 to the hoop body 146. The contact tip 147*a* is positioned on an upper surface 679 of the horizontal portion 678. When attached to the hoop body 146, the vertical portion 677 of the lifting finger 147 creates the spacing 179 between the lower surface 489 of the hoop body 146 and the contact tips 147*a*. The spacing 179 allows passage of substrates.

The vertical portion 677 and horizontal portion 678 of the lifting finger 147 may be formed from a metal. In one embodiment, the vertical portion 677 and horizontal portion 678 are formed from aluminum. The threaded insert 675 may be formed from a wear and galling resistive material, such as NITRONIC® stainless steel. The contact tip 147*a* may be formed from a ceramic material to reduce particle generation from contacting the substrate. In one embodiment, the contact tip 147*a* may be formed from silicon nitride. The contact tip 147*a* may include a ball or other raised feature 602 to reduce the area of surface contact with the substrate.

FIG. 7 is a partial sectional side view of the hoop assembly 144 showing the bellows 161 according to one embodiment of the present invention. Two shields 463, 464 are disposed around convolutions 761 of the bellows 161 to prevent particles from entering and becoming entrapped in the convolutions 761. In one embodiment, the bellows 161 is formed from a corrosion resistant material, for example HAYNES® 242 alloy.

In one embodiment, the convolutions 761 of the bellows 161 are designed to keep particles away from high stress locations to extend the life time of the bellows 161.

FIGS. 8A and 8B schematically illustrate a portion of the convolutions 761 of the bellows 161 in extended and compressed positions, respectively. A concaved curve 862 is formed near an internal welded location 863 of high stress. As shown in FIG. 8A, while the convolutions 761 are at an extended position, external particles may enter the convolutions 761 along path 861. As the convolutions 761 compress (as shown in FIG. 8B), the concaved curve 862 remains concaved and the particles eventually gather at the bottom of the concaved curve 862 where there is more clearance and lower stress. Thus, the bellows 161 prevents particles from moving towards the internal welded location 863 avoiding further stress at the internal welded location 863.

The hoop assembly 144 according to embodiments of the present invention has several advantages. First, the hoop assembly saves space and simplifies the rest of the chamber design. Second, the hoop assembly allows the chamber body geometry to be decoupled from the substrate confinement region geometry, providing a symmetrical or other predetermined substrate confinement region even if the chamber body has an irregular shape to accommodate other components in the chamber. Third, the hoop assembly allows the substrate processing area to be surrounded by material different than that of the chamber body. For example quartz, instead of aluminum, may be used to confine the processing environment to reduce radical recombination of the plasma within the processing area.

Furthermore, the geometry of the confinement ring 145 and the focus ring 151 around the substrate support pedestal assembly 132 may be sized to control the gas conductance therebetween. The conductance between confinement ring 145 and the focus ring 151 may be selected to be high relative to a conductance between the top of the confinement ring 145 and the lid ring 127, thereby causing the majority of gas to flow downward inside the confinement ring 145 through the confinement region where the substrate 104 is located.

Even though a cylindrical hoop is described in the exemplary embodiments, the hoop can be designed to have other shapes to meet design requirements. For example, a rectangular hoop may be used in chambers for transfer or processing of rectangular substrates wherein the rectangular hoop still provides a symmetrical confinement region. Even though embodiments of the present invention are described above in application of load lock chambers, embodiments of the present invention can be applied to any process chamber.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    transferring a substrate through an opening of a processing chamber to three or more lifting fingers of a hoop assembly disposed in the processing chamber, wherein the hoop assembly comprises:
        a hoop body slanted from a handle portion to a frame portion;
        a confinement ring defining a confinement region therein; and
        the three or more lifting fingers extending below the confinement ring, wherein each of the three or more lifting fingers has a contact tip positioned radially inward from the confinement ring;
    lowering the hoop assembly to transfer the substrate from the three or more lifting fingers to a substrate support pedestal assembly disposed in the processing chamber;
    positioning the hoop assembly in a processing position wherein the confinement region is adjacent to the substrate disposed on the substrate support pedestal assembly with the confinement ring shielding the opening; and
    processing the substrate by supplying a processing gas to the confinement region with the hoop assembly in the processing position.

2. The method of claim 1, wherein positioning the hoop assembly in the processing position further comprises positioning the confinement ring to simultaneously surround both a lower surface of a showerhead disposed in the processing chamber and the substrate support pedestal assembly.

3. The method of claim 1, wherein lowering the hoop assembly comprises:
    lowering each of the three or more lifting fingers into a respective cut out in the substrate support pedestal assembly.

4. The method of claim 1, further comprising:
    heating the substrate using heaters in the substrate support pedestal assembly.

5. The method of claim 4, further comprising:
    controlling a rate and a direction of heat exchange to the substrate support pedestal assembly via a cooling adapter.

6. The method of claim 1, wherein the substrate support pedestal assembly remains centered in the processing chamber during heating of the substrate.

7. The method of claim 1, further comprising:
performing an abatement process to remove etching residue from the substrate.

8. The method of claim 1, further comprising:
removing photoresist from the substrate while positioned within the confinement region.

9. A method for processing a substrate, comprising:
lowering a hoop assembly to transfer a substrate from three or more lifting fingers to a substrate support pedestal assembly disposed in a processing chamber, the hoop assembly comprising:
 a hoop body slanted from a handle portion to a frame portion;
 a confinement ring defining a confinement region therein, the confinement region at least immediately above the substrate disposed on the substrate support pedestal assembly, and the confinement ring positioned at least partially within the hoop body; and
 the three or more lifting fingers extending below the hoop body and the confinement ring, each of the three or more lifting fingers having a contact tip positioned radially inward from the confinement ring to form a substrate support surface below and spaced apart from the confinement region;
positioning the hoop assembly in a processing position; and
processing the substrate by supplying a processing gas to the confinement region with the hoop assembly in the processing position.

10. The method of claim 9, further comprising:
shielding a substrate transfer opening of the processing chamber with the confinement ring.

11. A method for processing a substrate, comprising:
transferring a substrate to a hoop assembly through an opening in a processing chamber, the hoop assembly comprising:
 a hoop body slanted from a handle portion to a frame portion;
 a confinement ring defining a confinement region therein; and
 three or more lifting fingers extending below the confinement ring, each of the three or more lifting fingers having a contact tip positioned radially inward from the confinement ring to form a substrate support surface below the confinement region;
moving the substrate within the processing chamber by moving the hoop assembly to a processing position; and
performing an abatement process to remove etching residue from the substrate while positioned within the confinement region.

12. The method of claim 11, further comprising:
removing photoresist from the substrate while positioned within the confinement region.

13. The method of claim 12, wherein performing the abatement process comprises:
receiving a disassociated species in the processing chamber from a remote plasma source;
heating the substrate with heaters in a substrate support pedestal; and
sustaining a plasma formed from the disassociated species using a plasma generator.

14. The method of claim 13, further comprising:
raising the hoop assembly to the processing position, wherein each of the three or more lifting fingers move upward through a respective cut out in the substrate support pedestal.

* * * * *